United States Patent [19]

Huber et al.

[11] Patent Number: 5,400,548
[45] Date of Patent: Mar. 28, 1995

[54] PROCESS FOR MANUFACTURING SEMICONDUCTOR WAFERS HAVING DEFORMATION GROUND IN A DEFINED WAY

[75] Inventors: Anton Huber; Karl-Heinz Langsdorf, both of Burghausen, Germany

[73] Assignee: Wacker-Chemitronic Gesellschaft fur Elektronik-Grundstoffe mbH, Burghausen, Germany

[21] Appl. No.: 88,171

[22] Filed: Jul. 7, 1993

[30] Foreign Application Priority Data

Jul. 23, 1992 [DE] Germany ............ 42 24 395.5

[51] Int. Cl.6 ............ B24B 1/00; H01L 21/304
[52] U.S. Cl. ............ 451/41; 437/249; 451/55; 451/57; 451/63
[58] Field of Search ............ 437/974; 51/283 R, 324, 51/326, 281 SF

[56] References Cited

U.S. PATENT DOCUMENTS

| | | | |
|---|---|---|---|
| 1,401,831 | 12/1921 | Taylor | 51/283 |
| 2,699,633 | 1/1955 | Lapenas et al. | 51/216 |
| 4,896,459 | 1/1990 | Brandt | 51/5 C |
| 4,967,461 | 11/1990 | Feldmeier | 29/414 |
| 4,991,475 | 2/1991 | Malcok et al. | |

FOREIGN PATENT DOCUMENTS

| | | |
|---|---|---|
| 0272531 | 6/1988 | European Pat. Off. |
| 0410679 | 1/1990 | European Pat. Off. |
| 3613132 | 10/1987 | Germany |
| 3906091 | 8/1990 | Germany |
| 574612 | 2/1976 | Switzerland |
| 1238769 | 7/1971 | United Kingdom ............ 51/326 |

OTHER PUBLICATIONS

Landstein et al., "Forming a Crown Surface on the End of a Rod–Like Element", IBM TDB, vol. 20, No. 11A (Apr. 1978), p. 4332.

Primary Examiner—Olik Chaudhuri
Assistant Examiner—David E. Graybill
Attorney, Agent, or Firm—Collard & Roe

[57] ABSTRACT

A process for manufacturing semiconductor wafers having deformation ground in a defined way.

4 Claims, 3 Drawing Sheets

PROCESS FOR MANUFACTURING SEMICONDUCTOR WAFERS HAVING DEFORMATION GROUND IN A DEFINED WAY

BACKGROUND OF THE INVENTION

1. Field of the Invention

The present invention relates to semiconductor wafers having deformation ground in a defined way, and a method of producing such semiconductor wafers.

2. The Prior Art

In the production of semiconductor wafers, appreciable effort is expended on obtaining wafers which are as flat as possible. Only an extremely flat wafer surface ensures that the photolithographic application of electronic components to the wafer surface is achieved in a fault-free manner in the integration density which is now standard. Starting with the sawing of a wafer out of a rod-like single crystal and proceeding through to the surface finishing of the semiconductor wafer by lapping and polishing methods, the emphasis is therefore on obtaining semiconductor wafers having at least one plane surface.

In the further course of the processing of a semiconductor wafer, however, method steps are generally necessary which impair the flatness of the semiconductor wafer achieved up to that point. Because of the circular wafer shape, a rotationally symmetrical deformation of the semiconductor wafer is frequently to be observed after a single-sided treatment of a wafer surface. Thus, for example, the application or creation of one or more material layers (for example, by epitaxy or oxidation) on a preferred wafer surface results in stresses in the semiconductor material which cause a rotationally symmetrical deformation of the semiconductor wafer. A similar deformation occurs if a semiconductor wafer is etched, doped or subjected to a so-called damage treatment (the creation of defects in the crystal lattice) on one side. A precise inspection shows a semiconductor wafer treated in this way to be bowed.

A recognized measure of the deformation of a semiconductor wafer is the "warp." The warp specifies the difference between the maximum and the minimum distance of the center plane of the semiconductor wafer from a reference plane. It can be determined, for example, in a method of measurement in accordance with the U.S. Standard ASTM F 657-80. The one-sided treatment of a semiconductor wafer described above increased the warp. For ideally flat and plane-parallel wafer surfaces, the warp is equal to zero, unless the semiconductor wafer was already deformed in a defined way prior to the one-sided treatment so as to virtually or completely compensate for the additional rotationally symmetrical deformation. In the latter case, the warp would become smaller and the flat wafer geometry necessary for a fault-free photolithographic application of electronic components would be achieved.

The total thickness variation (TTV value) of a semiconductor wafer is particularly suitable for assessing the parallelism of the wafer surfaces. Referred to as the TTV value is the absolute amount of the thickness values of a semiconductor wafer determined from a multiplicity of point measurements. The TTV value does not therefore change if a semiconductor wafer deforms as a consequence of a one-sided treatment of its surface. A prerequisite for this is, however, that the treatment does not alter the wafer thickness non-uniformly.

German Published Application No. 3,906,091 A1 and corresponding U.S. Pat. No. 4,991,475, disclose that deformed semiconductor wafers can be created by influencing certain parameters during the cutting of semiconductor wafers from crystal rods by means of annular saws. However, the precision of this method is not sufficient to consistently reproduce semiconductor wafers having the same identical defined deformation or warp.

SUMMARY OF THE INVENTION

It is an object of the present invention to provide semiconductor wafers having a defined deformation (i.e., having a defined warp), and to provide a method by which such semiconductor wafers can be produced.

The semiconductor wafers according to the invention have a rotationally symmetrical curved front surface and a back surface which extends parallel to the front surface. The curvature of the front surface is ground into the surface of the semiconductor wafers. Preferably, the rotationally symmetrical curvature is concavely, convexly or conically formed. The degree of deformation of the semiconductor wafers as expressed by their warp is adjusted in a defined way. The preadjustment of the warp is made possible by a method which is described below.

First, semiconductor wafers are cut in a manner known per se from the end face of a rod-like, or rod-shaped semiconductor crystal, for example by means of an annular saw. It should be ensured that the chosen sawing method generates at least one wafer surface which is as flat as possible. Preferably, a surface-ground surface is created on one side of the semiconductor wafer produced by a prior end-face grinding of the crystal face. Such a sawing method is disclosed in German Patent specification 3,613,132 C2 and in corresponding U.S. Pat. No. 4,896,459.

The semiconductor wafer cut from the crystal rod is then placed by means of its first surface on the pickup of a surface-grinding machine. The side of the wafer which has the greater flatness is regarded as the first surface of the semiconductor wafer. If the end face of the crystal rod was surface-ground prior to cutting the semiconductor wafer, the semiconductor wafer is placed by means of the surface-ground surface on the wafer pickup. The opposite, second surface of the semiconductor wafer is then ground in a first grinding step. Suitable surface-grinding machines are, in particular, single-wafer grinding machines which employ the operational principle of surface rotation grinding disclosed in European Patent Application No. 272,531 A1. In this case, not only the wafer pickup with the semiconductor wafer fixed thereon rotates, but the axially fed grinding tool (for example, a disk wheel or peripheral grinding wheel) also rotates. During the grinding of the second surface of the semiconductor wafer in the first grinding step, it must be ensured that the axis of rotation of the grinding tool is inclined with respect to the axis of rotation of the wafer pickup. As a result of this procedure, a semiconductor wafer having a rotationally symmetrically curved surface is produced. The curvature of the wafer surface depends on the angle of inclination which the axes of rotation of wafer pickup and grinding tool assume with respect to one another during the surface rotation grinding and can therefore be adjusted in a defined way.

After the first grinding step of the method of the invention, the semiconductor wafer is turned over and fixed on a wafer pickup by means of the second surface, which has just been ground. The entire second surface of the semiconductor wafer must rest tangentially on the wafer pickup. Preferably, the semiconductor wafer is held by suction onto a vacuum pickup so that it completely conforms to the pickup face. In this position, the first wafer surface is now ground parallel to the pickup face of the wafer pickup in a second grinding step of the method of the invention. In addition to the surface rotation grinding already mentioned, plunge-cut grinding and surface side grinding methods can be used. In the latter case, only the grinding tool rotates.

When released from the wafer pickup after the second grinding step, the semiconductor wafer springs back into a shape which is essentially defined by the first grinding step. The wafer surfaces are curved in a rotationally symmetrical manner and extend parallel to one another. The semiconductor wafer has a deformation (i.e., a warp), ground in a defined way which is determined in the first grinding step by the choice of angle of inclination which the axes of rotation of the grinding tool and the wafer pickup assume with respect to one another.

In another embodiment of the method according to the invention, a surface side grinding machine is used in the first grinding step and the tool is moved in such a way that the ground surface appears saddle-shaped. After the second grinding step, the semiconductor wafer is also deformed in a saddle shape and has parallel surfaces. The curvature imparted to the wafer surface in the first semiconductor wafer grinding step does not therefore necessarily have to be rotationally symmetrical.

The method of the invention can be applied to all semiconductor wafers which are sufficiently elastic and can be placed without crushing on a wafer pickup in the second grinding step in such a way that the wafer surface facing the pickup face rests completely tangentially on the latter. Using the method it is possible to set a warp which is greater, the greater the diameter and the smaller the thickness of the semiconductor wafer used. For silicon wafers, which are particularly well suited for the method, however, deformations can be achieved which are a multiple of the warp to be expected as a result of a one-sided treatment of a wafer surface. For silicon wafers which have been treated on one side, the warp is typically up to approximately 50 $\mu$m for wafers having a diameter of 200 mm and up to approximately 150 $\mu$m for wafers having a diameter of 100 mm.

The precision with which the warp of a semiconductor wafer can be adjusted by the method according to the invention depends on the flatness of the semiconductor wafer prior to the first grinding step and on the precision with which the axis of rotation of the grinding tool can be aligned during the first grinding step. With machines which are commercially available at the present time, a warp adjustment having a precision of less than 2 $\mu$m is possible for silicon wafers.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
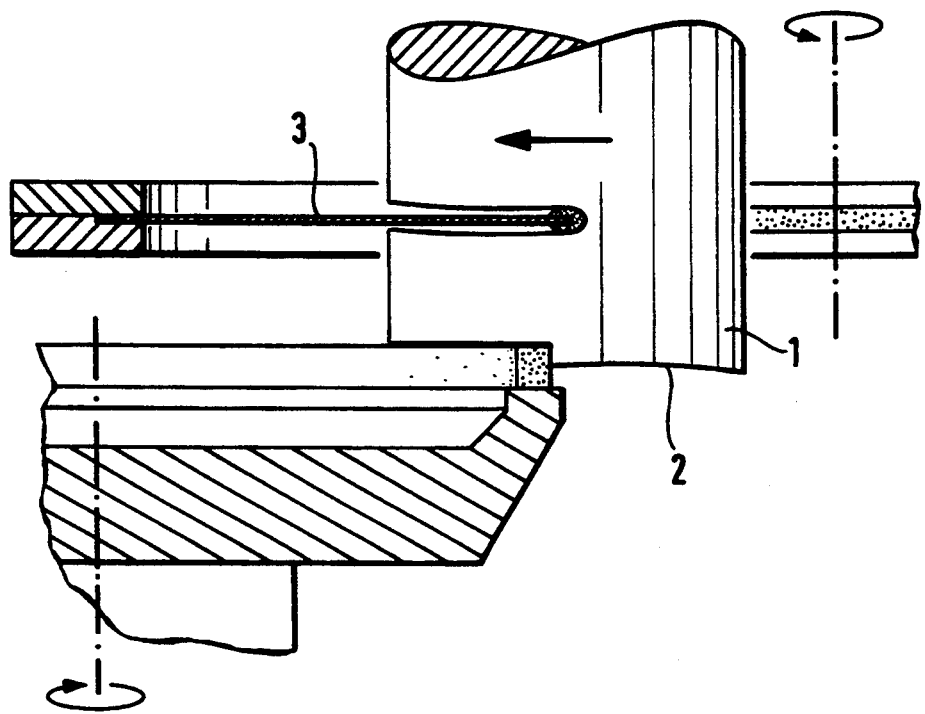
FIG. 1 shows an end-face surface grinding of the crystal rod and cutting of a semiconductor wafer.
Figure 2:
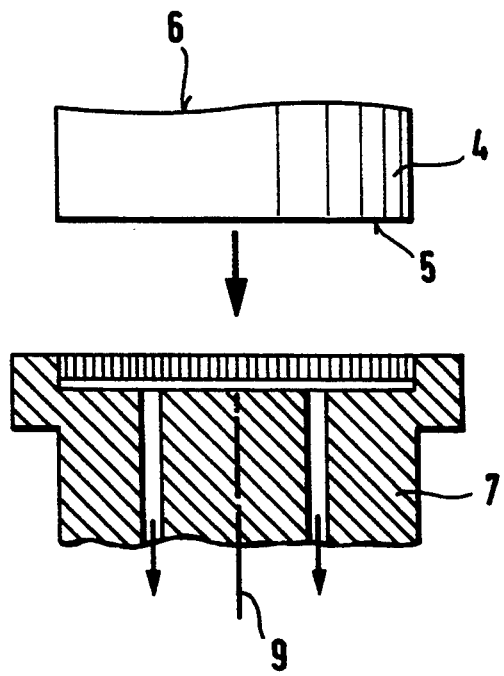
FIG. 2 shows attaching the semiconductor wafer by means of the first surface-ground surface onto a wafer pickup.

Turning now in detail to the drawings, FIG. 1 shows the cutting of a semiconductor wafer from the end face of a rod-like semiconductor crystal 1. It is irrelevant whether the end face 2 of the rod is ground before or while the saw blade of the annular saw 3 is cutting the semiconductor wafer. The resultant semiconductor 4 has a surface-ground first surface 5 and a normally less flat second surface 6 (FIG. 2). The semiconductor wafer is placed by means of the first surface onto the pickup 7 of a rotary surface grinding machine and fixed thereto, for example, by applying a vacuum. The pickup rotates along with the semiconductor wafer placed onto it during the subsequent surface grinding.

Figure 3:
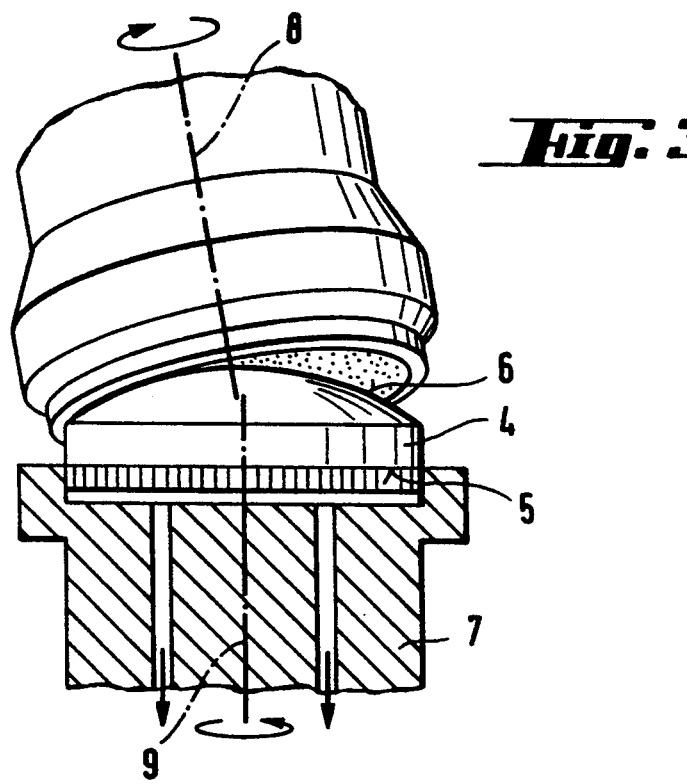
FIG. 3 shows grinding the semiconductor wafer with an axis of rotation of the grinding tool which is inclined with respect to the axis of rotation of the wafer pickup.

It can be seen from FIG. 3 that the axis of rotation 8 of the grinding tool is inclined with respect to the axis of rotation 9 of the pickup 7 during this first grinding step of the method. In principle, the axis of rotation of the grinding tool can be tilted in one spatial direction, for example to the right or to the rear, or in two spatial directions, for example to the right and to the rear, with respect to the axis of rotation of the wafer pickup. The ground wafer surface acquires a curved appearance as a result of the first grinding step. The curvature of the surface is rotationally symmetrical and, depending on the inclined arrangement of the axes of rotation set, it is concave, convex (shape of a spherical segment with inclination of the axis of rotation of the grinding tool in two spatial directions) or conical (with inclination of the axis of rotation of the grinding tool in one spatial direction).

Figure 4:
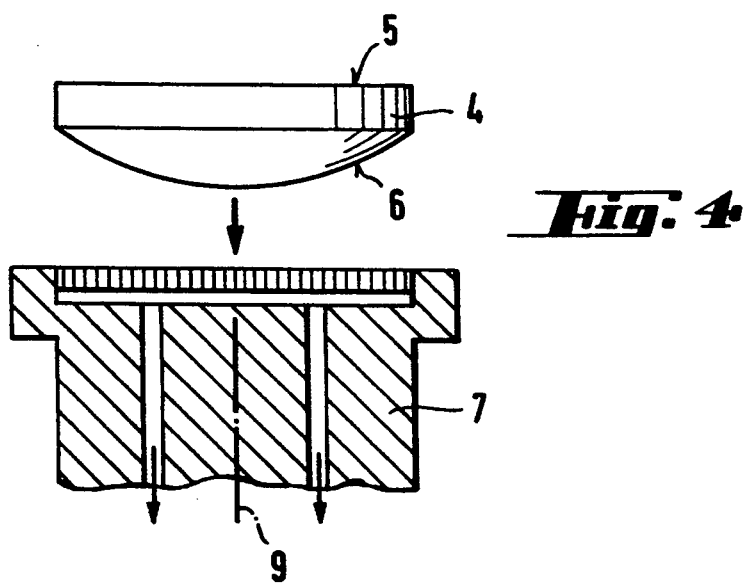
FIG. 4 shows placing the semiconductor wafer onto a wafer pickup by means of the second surface.
Figure 5:
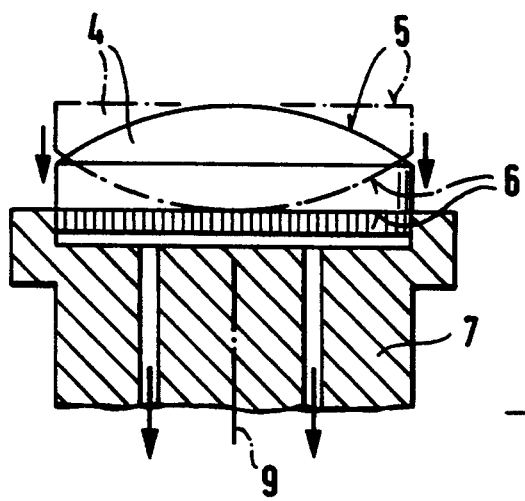
FIG. 5 shows attaching the semiconductor wafer onto the wafer pickup.

According to FIG. 4, the semiconductor wafer is turned over and placed by means of the second surface 6, which is now curved, onto a wafer pickup 7. Preferably, a vacuum pickup is used which applies a suction to hold the semiconductor wafer on, so that it rests by means of the entire second surface tangentially on the pickup face. As indicated in FIG. 5, due to the elasticity of the semiconductor material, the curvature of the vacuum held wafer surface is transmitted to the opposite, first surface 5 of the semiconductor wafer. This is only the case for as long as the semiconductor wafer is fixed on the wafer pickup.

Figure 6:
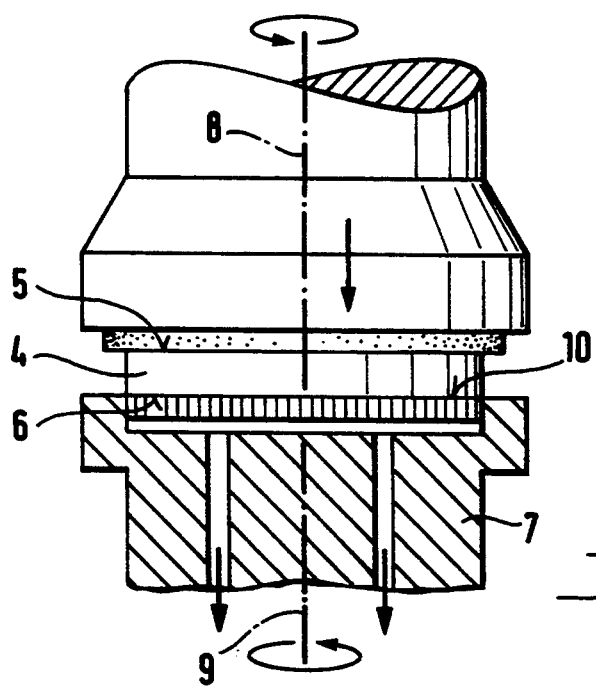
FIG. 6 shows grinding the wafer surface parallel to the pickup surface of the wafer pickup.

FIG. 6 shows how the free, first surface of the semiconductor wafer vacuum held onto the vacuum pickup is ground over in a second grinding step parallel to the pickup face. Although the pickup face 10 is shown as flat and horizontal in the figure, this does not necessarily have to be the case. The pickup face could also have another shape, for example be conically formed. In such cases, it is only more complex to grind the first wafer surface parallel to the pickup face because the axes of rotation of the pickup and of the grinding tool have to be inclined in a suitable manner.

Figure 7:
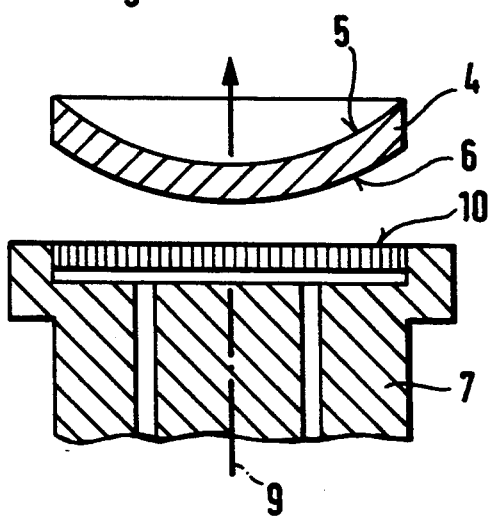
FIG. 7 shows removal of the semiconductor wafer from the pickup.

If the semiconductor wafer is taken from the vacuum pickup after being ground over, as shown in FIG. 7, it springs back into its unstressed shape. In that case, the wafer surfaces 5, 6 remain parallel to one another. The semiconductor wafer is deformed in a defined way in accordance with the curvature of the second wafer surface as a consequence of the first grinding step. The warp of the semiconductor wafer resulting after the second grinding step can be adjusted in a defined way in the first grinding step by means of the inclined position of the axes of rotation of grinding tool and pickup.

The deformation of the semiconductor wafer is impressed relative to the crystal structure, so that the semiconductor wafers can be treated further using standard manufacturing methods, such as lapping, etching or polishing, without the set deformation being impaired in the process.

The method according to the invention advantageously produces surface-ground semiconductor wafers whose warp is chosen so as to compensate for the wafer deformation to be expected in a one-sided wafer treatment, so that, after such a treatment, semiconductor wafers are provided which have plane-parallel surfaces.

The invention will now be further explained by reference to the following example which is non-limitative of the invention.

EXAMPLE

A total of 18 semiconductor wafers were cut from a rod-like silicon single crystal by means of an annular saw. The end face of the rod was surface-ground prior to every sawing operation. The semiconductor wafers produced had a diameter of 200 mm and a thickness of 760 $\mu$m. Groups of 6 of these semiconductor wafers were each to be provided with a defined warp of 25 $\mu$m, 45 $\mu$m and 75 $\mu$m by the method according to the invention. During the rotary surface grinding in the first grinding step, the axis of rotation of the grinding tool was inclined in two spatial directions (to the right and to the rear) with respect to the axis of rotation of the wafer pickup, so that the ground wafer surface assumed the shape of a spherical segment. During this grinding step, the semiconductor wafers rested on a vacuum pickup by means of their surface which had been surface-ground during the end-face grinding of the crystal. The angle of inclination of the axes of rotation was chosen so that the ground semiconductor wafer had a TTV value corresponding to the required warp. The dome shape and the dome height were checked with the aid of an inductive differential measurement probe.

A wafer ground in this manner was then turned over and vacuum held onto the vacuum pickup so that the wafer surface facing the pickup was completely in contact with the pickup face. In a second grinding step, the axis of rotation of the rotating grinding tool was aligned so that the semiconductor wafer was ground parallel to the pickup face. The full ground semiconductor wafers were subjected to a standard etching treatment which removes material uniformly from the wafer surface in order to remove subsurface damage as a consequence of the grinding treatment. Finally, the TTV value of these wafers was determined as a measure of the parallelism of a wafer and the warp as a measure of the deformation of the wafer. The warp was measured in an area-covering manner using a commercial warp measuring instrument. From the measurement results listed in the Table it can be inferred that the TTV values set in the first grinding step correlate well with the warp of the full ground semiconductor wafers and vary only to a minimum extent from the required warp. Furthermore, the surfaces of the semiconductor wafers created are virtually parallel.

TABLE

| Wafer No. | TTV 1 | TTV 2 | Warp 2 |
|---|---|---|---|
| 1 | 74 | 2.4 | 72.5 |
| 2 | 76 | 2.7 | 70.4 |
| 3 | 74 | 2.8 | 71.7 |
| 5 | 74 | 3.1 | 72.7 |
| 6 | 79 | 3.3 | 73.2 |
| 7 | 47 | 2.7 | 46.8 |
| 8 | 48 | 2.8 | 45.6 |
| 9 | 47 | 2.3 | 44.4 |
| 10 | 47 | 2.9 | 44.1 |
| 11 | 47 | 2.4 | 44.7 |
| 12 | 46 | 3.2 | 43.0 |
| 13 | 26 | 2.3 | 24.4 |
| 14 | 27 | 2.4 | 25.6 |
| 15 | 25 | 1.9 | 24.8 |
| 16 | 27 | 2.1 | 25.7 |
| 17 | 26 | 2.6 | 24.0 |
| 18 | 27 | 2.8 | 24.9 |

TTV 1: TTV value after the first grinding step, in $\mu$m
TTV 2: TTV value after the second grinding step and etching, in $\mu$m
Warp 2: warp after the second grinding and the etching treatment, in $\mu$m While several embodiments of the present invention have been shown and described, it is to be understood that many changes and modifications may be made thereunto without departing from the spirit and scope of the invention as defined in the appended claims.

What is claimed is:

1. A method of producing semiconductor wafers having ground warp deformation from semiconductor wafers which are cut from the end face of a rod-shaped semiconductor crystal, which method comprises:
   (a) fixing the semiconductor wafer onto a wafer pickup with a first surface of the wafer, the wafer pickup having an axis of rotation;
   (b) in a first grinding step, grinding an opposite, second surface of the semiconductor wafer with a grinding tool having an axis of rotation, said grinding tool and said wafer pickup rotating during the grinding and the axis of rotation of the grinding tool being inclined in one spatial direction with respect to the axis of rotation of the wafer pickup; and
   (c) in a second grinding step, grinding the first surface of the semiconductor wafer parallel to a pickup face of said wafer pickup, the second surface of the semiconductor wafer being held tangentially to the wafer pickup during the second grinding step.

2. The method as claimed in claim 1, further comprising
   cutting the semiconductor wafer from a rod-shaped semiconductor crystal which has a ground end face; and
   the ground end face of the semiconductor crystal comprising said first surface of the semiconductor after finishing the cutting action.

3. A method of producing semiconductor wafers having ground warp deformation from semiconductor wafers which are cut from the end face of a rod-shaped semiconductor crystal, which method comprises:
   (a) fixing the semiconductor wafer onto a wafer pickup with a first surface of the wafer, the wafer pickup having an axis of rotation;
   (b) in a first grinding step, grinding an opposite, second surface of the semiconductor wafer with a grinding tool having an axis of rotation, said grinding tool and said wafer pickup rotating during the grinding and the axis of rotation of the grinding tool being inclined in two spatial directions with respect to the axis of rotation of the wafer pickup; and
   (c) in a second grinding step, grinding the first surface of the semiconductor wafer parallel to a pickup face of said wafer pickup, the second surface of the semiconductor wafer being held tangentially to the wafer pickup during the second grinding step.

4. The method as claimed in claim 3, further comprising
   cutting the semiconductor wafer from a rod-shaped semiconductor crystal which has a ground end face; and
   the ground end face of the semiconductor crystal comprising said first surface of the semiconductor after finishing the cutting action.

* * * * *